United States Patent [19]

Witte

[11] Patent Number: 5,233,546
[45] Date of Patent: Aug. 3, 1993

[54] ANTI-ALIAS FILTERING APPARATUS FOR FREQUENCY DOMAIN MEASUREMENTS

[75] Inventor: Robert A. Witte, Monument, Colo.

[73] Assignee: Hewlett-Packard Company, Palo Alto, Calif.

[21] Appl. No.: 745,030

[22] Filed: Aug. 14, 1991

[51] Int. Cl.[5] .............................................. G06J 1/00
[52] U.S. Cl. ................................................... 364/602
[58] Field of Search ............... 364/602, 604, 825, 827, 364/724.01, 726, 724.1, 487, 724.16; 315/1; 328/167

[56] References Cited

U.S. PATENT DOCUMENTS

| | | | |
|---|---|---|---|
| 4,476,539 | 10/1984 | Tamori et al. | 364/825 |
| 4,621,217 | 11/1986 | Saxe et al. | 315/1 |
| 4,802,098 | 1/1989 | Hansen et al. | 364/487 |

Primary Examiner—Long T. Nguyen

[57] ABSTRACT

A filtering apparatus permits alias-free frequency domain measurement in any of a plurality of measurement bandwidths. The input signal is first passed through one of a plurality of low-pass filters. The appropriate filter is selected by a controller to provide a cut-off frequency at least as great as the selected measurement bandwidth. An analog-to-digital convertor ("ADC") samples the filtered input signal at a sample rate ($f_s$) set by the controller to be at least twice the measurement bandwidth. The digitized samples are then processed by a digital low-pass filter (i.e. a finite impulse response filter) to further reduce the bandwidth of the input signal to the measurement bandwidth. Operation of the digital filter is controlled by a number of filter coefficients provided by the controller as a function of the desired measurement bandwidth. A memory is provided between the ADC and the digital filter. The samples output by the ADC can be processed in real time by the digital filter if the sample rate is sufficiently low, or the samples can be stored in the memory for subsequent processing by the digital filter if a higher sample rate is required. The number of samples can be reduced by adding a decimator which outputs only one sample from each series of K samples received from the digital filter, provided $f_s/K$ is at least twice the measurement bandwidth.

10 Claims, 7 Drawing Sheets

ANTI-ALIAS FILTERING APPARATUS FOR FREQUENCY DOMAIN MEASUREMENTS

BACKGROUND OF THE INVENTION

1. Field of the Invention

The present invention relates generally to the field of frequency domain signal processing. More specifically, the present invention discloses a filtering apparatus to prevent signal aliasing in frequency domain measurements of the type performed by digital oscilloscopes and spectrum analyzers.

2. Statement of the Problem

Many oscilloscope users have a need to view signals in both the time domain (input voltage as a function of time) and the frequency domain (input voltage as a function of frequency). This need has been partially met by the use of the fast Fourier transform ("FFT") on time domain data in a conventional digital oscilloscope. However, this method can result in signal aliasing—where the digitized signal bears no real relationship to the actual input signal. Aliasing occurs when the sample rate of the digital oscilloscope is relatively near the input frequency. For example, consider a situation with a sample rate of 10 KHz and an input signal in the form of a sine wave whose frequency differs from the sampling frequency by 0.1%. (e.g. 10 KHz+10 Hz, or 10,010 Hz). Aliasing will cause the digitized signal to appear as a sine wave having a frequency of 10 Hz, not 10.01 KHz.

Aliasing is prevented if the input signal is sampled at a rate greater than twice the highest frequency present in the input signal. This is known as the Nyquist limit. Therefore, one solution to aliasing is to add circuitry (e.g. a low-pass filter) to bandwidth limit the input signal below the Nyquist limit before it is digitized. A number of approaches have used in the past to address the problem of aliasing:

Digital Oscilloscope with Fixed Filter. FIG. 4 shows a simplified block diagram of a conventional digital oscilloscope operating in FFT mode with a single analog low-pass filter 10. The filter has a fixed cut-off frequency which bandlimits the input signal to prevent aliasing at the highest sample rate. The input signal is then sampled and digitized by an analog-to-digital convertor 20 ("ADC") controlled by a variable clock 30. The digitized data is stored in a memory 40 for subsequent processing by the FFT processor 50 which generates a frequency domain display. However, it is important to note that the sample rate of the ADC 20 can be adjustably reduced below the maximum sample rate as a function of the timebase setting for the oscilloscope display (i.e. time / div.) selected by the user. Since the cut-off frequency of the low-pass remains fixed even if the sample rate is reduced, the oscilloscope is not alias-protected to the extent the sample rate is reduced below the Nyquist limit for the input signal. In other words, the anti-aliasing filter 10 is completely effective only at the highest sample rate.

Digital Oscilloscope with Selectable Filters.

The situation can be improved to a degree by adding a bank of selectable analog low-pass filters as shown in FIG. 5. In general, a separate low-pass filter is required for each sample rate (i.e. for each timebase setting) of the oscilloscope. Since oscilloscopes commonly have many timebase settings, this approach requires twenty or more individual filters. For example, a 100 MHz oscilloscope typically has 26 distinct timebase settings ranging from 5 sec/div to 2 nsec/div. Therefore, the disadvantage of this approach is the large number of filters required.

FFT Spectrum Analyzer.

FFT spectrum analyzers use a different system architecture to implement a frequency domain measurement based on the FFT, as shown in FIG. 6. An analog low-pass filter 10 bandlimits the input signal. The ADC 20 samples at a fixed rate, $f_s$, which is high enough relative to the cut-off frequency of the filter 10 to prevent aliasing. Bandwidth reduction is achieved by means of a digital filter 35 such as a finite impulse response ("FIR") filter. After the bandwidth has been reduced, the sample rate can also be reduced without losing information by means of a decimator 38 which discards all but every $k^{th}$ sample. The analog low-pass filter 10 can be viewed as providing alias protection for the digital FIR filter 35, while the digital FIR filter 35 provides alias protection at the reduced bandwidth and sample rate output by the decimator 38. Unfortunately, since the ADC 20 operates at a fixed sample rate, $f_s$, the digital FIR filter 35 must also process the data in real time at this same rate. The sample rate is effectively limited by the speed of the digital filter hardware, and at high sample rates (e.g. greater than 25 MHz) the hardware requirements of this approach become very difficult to implement.

Digital Oscilloscooe with Post-Acquisition Digital Filter. FIG. 7 provides a block diagram of an approach which alleviates the problem of having to operate the digital filter 35 in real time at the full sample rate. In this approach, a memory 25 is placed in front of the digital filter 35. The sampled data from the ADC 20 is stored in the memory and the digital filter 35 can operate on the data at less than real time. In order not to miss any samples, the memory must be large enough to hold all of the unfiltered sample data required by the digital filter 35. This dictates a very large memory. For example, 10 seconds of data at a sample rate of 400 MHz would require a memory size of 4 gigasamples. Alternatively, if the memory is limited to a reasonable size, the range of sample rates is limited, which in turn limits the range in input frequencies that can be accurately represented.

In addition to previously discussed approaches, a number of existing patents disclose solutions to the problem of signal aliasing, including the following:

| Inventor | Patent No. | Issue Date |
| --- | --- | --- |
| Hansen, et al. | 4,802,098 | Jan. 31, 1989 |
| Saxe, et al. | 4,621,217 | Nov. 4, 1986 |

Hansen, et al., disclose a digital bandpass oscilloscope in which the input signal is first filtered by an analog low-pass filter 12, converted to digital form by a digitizer 16, processed by a waveform data processing unit 18 which quadrature modulates, decimates and low-pass filters the digital data to provide waveform data sequences a(m) and b(m) which are stored in memory 20. FFT analysis is provided by a microprocessor 22 acting on the data sequences stored in the memory 20. The architecture of this portion of the Hansen system is similar to a conventional FFT spectrum analyzer, as discussed above and shown in FIG. 6. The disadvantage of this approach is that the waveform data processing unit 18 must process the data in real time at the sample rate of the digitizer 16. As previously mentioned, this is difficult to implement at high sample rates.

Saxe, et al. disclose an anti-aliasing filter arrangement for oscilloscopes that is a variation on the conventional approach of using a selectable bank of analog filters shown in FIG. 5. A plurality of selectable analog low-pass filters 17, 18, and 19 are used at the higher sweep rates. However, a "digital transversal filter" 32 is used at the lowest band. This filter is actually an analog implementation of a finite impulse response filter, requiring analog delay, multiplier, and sample and hold circuitry. This arrangement is effectively a variation on the idea of using a bank of selectable low-pass filters, as shown in FIG. 5.

3. Solution to the Problem

None of the prior art approaches resolve all of the shortcomings previously discussed. The simplest embodiment of the present invention operates in two basic modes: high band mode and low band mode. In the high band mode, a 100 MHz low-pass filter is used with an ADC sample rate of 400 MHz. The sampled waveform data is stored in a 10K memory. A digital FIR filter and a decimator then process the stored data. Low band mode is used to sample rates below 40 MHz. In low band mode, the 5 MHz low-pass filter is selected and the ADC is operated at 20 MHz. Since the sampled data is now coming out of the ADC at 20 MHz, the digital FIR filter is able to process the data in real time and the 10K memory is not used and can be bypassed.

This solution has the advantage of requiring only two analog low-pass filters. A fast memory is required, but does not have to be unreasonably large. The digital filter is not required to operate at high sample rates. Most importantly, the frequency domain display is properly bandlimited in all cases so that aliasing cannot occur.

SUMMARY OF THE INVENTION

This invention provides a filtering apparatus to enable alias-free frequency domain measurement in any of a plurality of measurement bandwidths. The input signal is first passed through one of a plurality of low-pass filters. The appropriate filter is selected by a controller to provide a cut-off frequency at least as great as the selected measurement bandwidth. An analog-to-digital convertor ("ADC") samples the filtered input signal at a sample rate ($f_s$) set by the controller to be at least twice the measurement bandwidth. The digitized samples are then processed by a digital low-pass filter (i.e. a finite impulse response filter) to further reduce the bandwidth of the input signal to the measurement bandwidth. Operation of the digital filter is controlled by a number of filter coefficients provided by the controller as a function of the desired measurement bandwidth. A memory is provided between the ADC and the digital filter. The samples output by the ADC can be processed in real time by the digital filter if the sample rate is sufficiently low, or the samples can be stored in the memory for subsequent processing by the digital filter if a higher sample rate is required. The number of samples can be reduced by adding a decimator which outputs only one sample from each series of K samples received from the digital filter, provided $f_s/K$ is at least twice the measurement bandwidth.

A primary object of the present invention is to provide a filtering apparatus that eliminates signal aliasing for any of a range of measurement bandwidths.

Another object of the present invention is to provide an anti-aliasing filtering apparatus that does not require a large number of analog low-pass filters, does not require an inordinately large memory, and is capable of operation at high sample rates and bandwidths.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings in which.

DETAILED DESCRIPTION OF THE INVENTION

Figure 1:
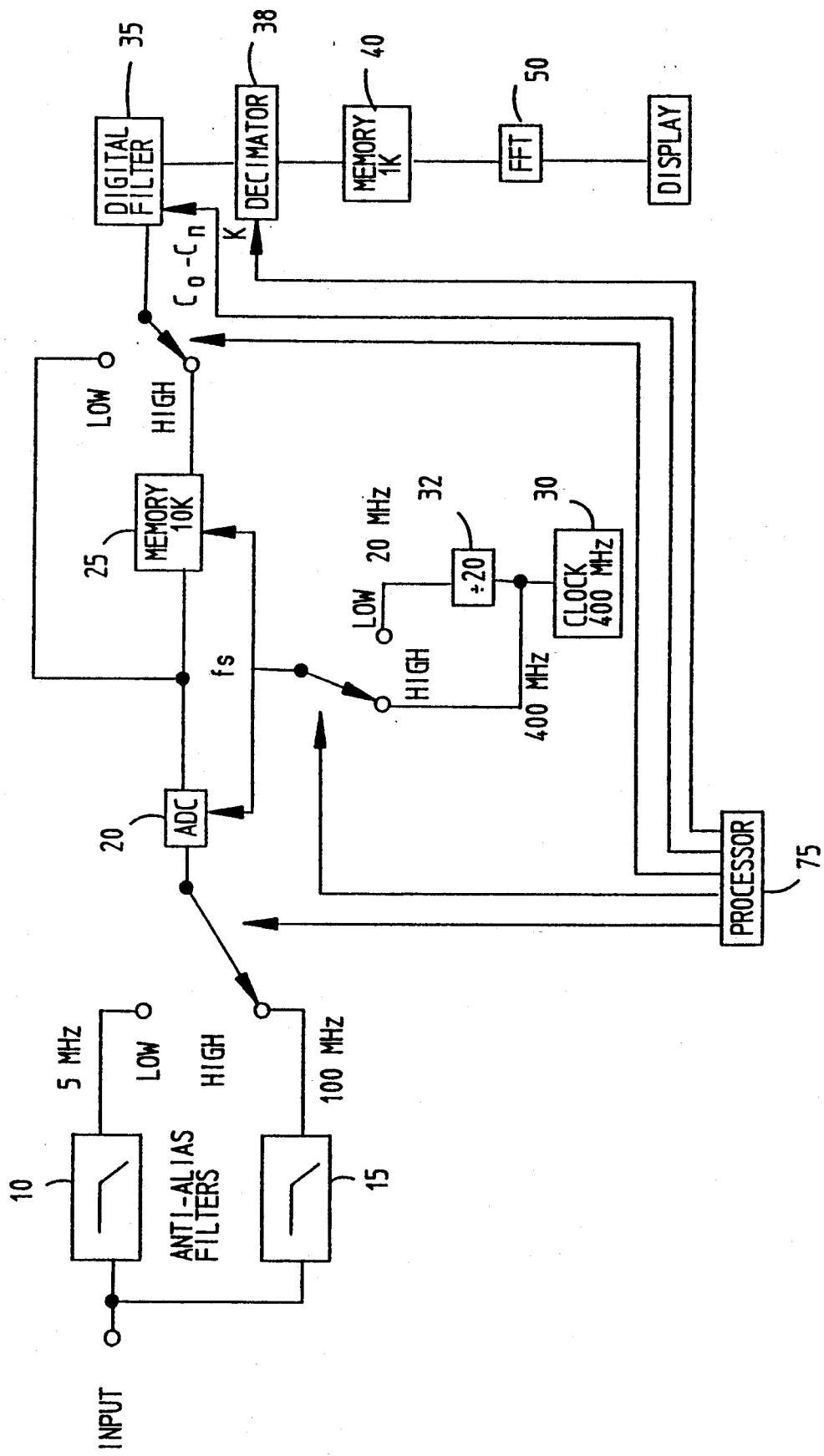
FIG. 1 is a schematic block diagram showing the major components of the present invention implemented for two bands of operation.

FIG. 1 provides a simplified block diagram of the present invention as implemented with two bands or modes of operation. Table 1 is the corresponding state table for this implementation. Two analog low pass filters 10 and 15 are connected in parallel to the input terminal. The first filter 15 has a cut-off frequency of approximately 100 MHz and the second filter 10 has cut-off frequency of approximately 5 MHz.

A processor 75 provides overall control of the instrument. The user manually selects the range of frequencies (i.e. the measurement bandwidth) to be included in the frequency domain measurement by the instrument. For example, in the case of a digital oscilloscope or spectrum analyzer, the user can specify the measurement bandwidth by selecting a dial setting on the face of the instrument. The first column in Table 1 lists the various measurement bandwidths typically available on a digital oscilloscope. Given a measurement bandwidth specified by the user, the processor 75 selects the appropriate band or mode of operation for the instrument. In the example depicted in FIG. 1 and Table 1, the two analog low-pass filters 15 and 10 correspond to a high band and a low band of operation, respectively. The processor 75 selects the filter having the lowest cut-off frequency to prevent aliasing, but which is no lower than the measurement bandwidth. For example as shown in Table 1, the 100 MHz filter 15 is selected by the processor 75 for measurement bandwidths of 100 MHz, 50 MHz, 20 MHz, and 10 MHz (high band). The 5 MHz filter 10 is used for measurement bandwidths of 5 MHz, 2 MHz, 1 MHz, 500 KHz, 200 KHz, 100 KHz and 50 KHz (low band).

The filtered input signal is passed to an analog-to-digital convertor ("ADC") 20 which samples and outputs a digital representation of the signal at a sample rate ($f_s$) controlled by the processor 75. The clock 30 produces clock pulses at 400 MHz. The divider 32 reduces this rate to 20 MHz. In the high band, the processor 75 connects the clock 30 directly to the clock input of the ADC 20 to drive the ADC at a high sample rate (400 MHz). In the low band, the processor connects the divider 32 to drive the ADC 20 at a low sample rate (20 MHz). This arrangement insures that the sample rate $f_s$ always exceeds the Nyquist limit (i.e. $f_s$ is at least twice the analog filter bandwidth) to prevent signal aliasing at any measurement bandwidth setting.

The digitized samples output by the ADC 20 are passed for processing by a digital low-pass filter 35. If the low sample rate (20 MHz) is being used, the digital filter 35 is capable of processing the samples in real time as they are output by the ADC 20. Therefore in the low band, the processor 75 directly connects the digital filter 35 to the output of the ADC 20. However, in the high band, a memory 25 is interposed between the ADC 20 and the digital 35 for temporary storage of the samples. A number of samples are stored in the memory 25 as they are output by the ADC 20. These samples can subsequently be retrieved and processed by the digital filter 35 at a slower rate.

Figure 3:
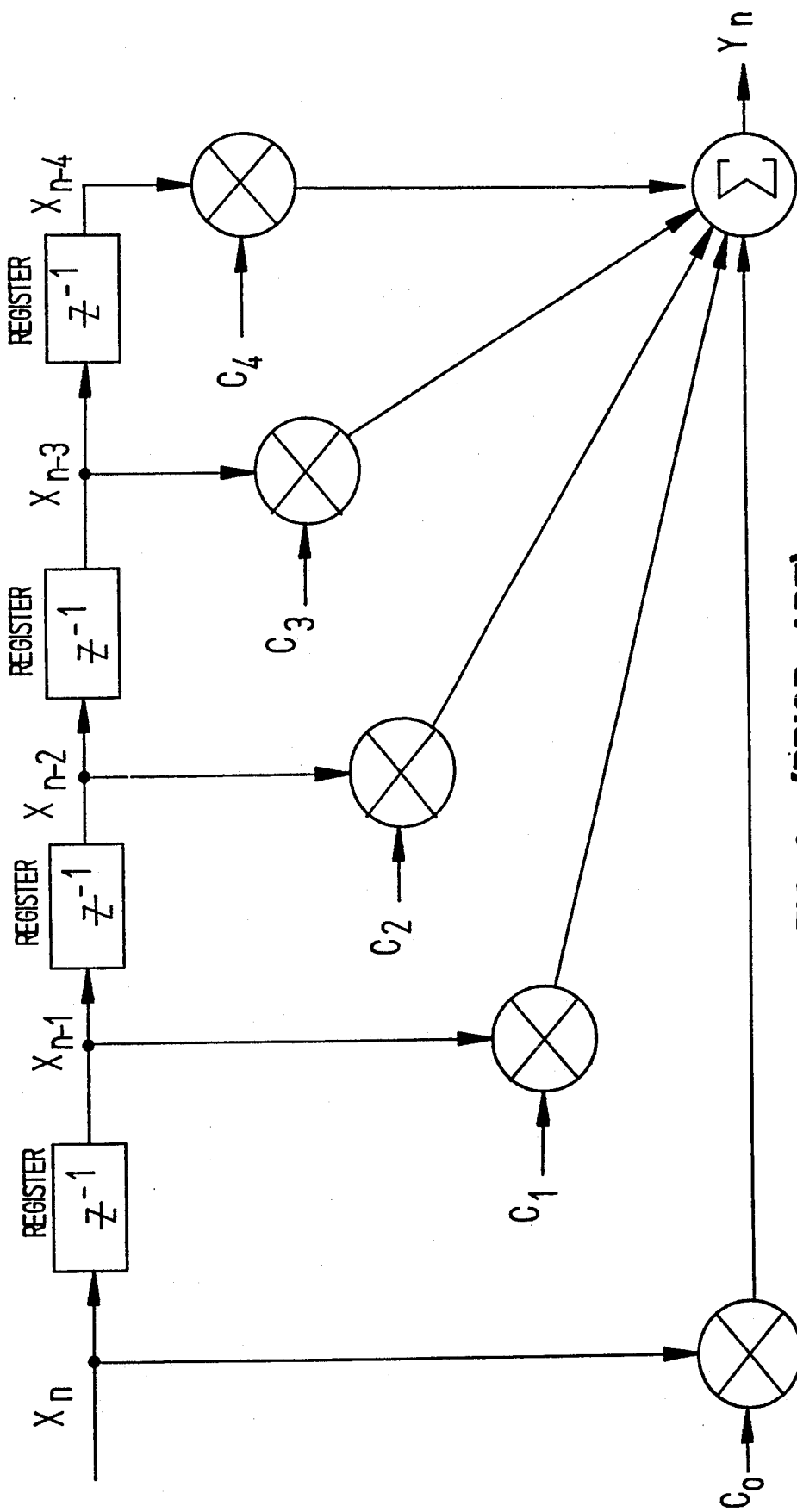
FIG. 3 is a schematic block diagram of a digital finite impulse response ("FIR") filter.
Figure 4:
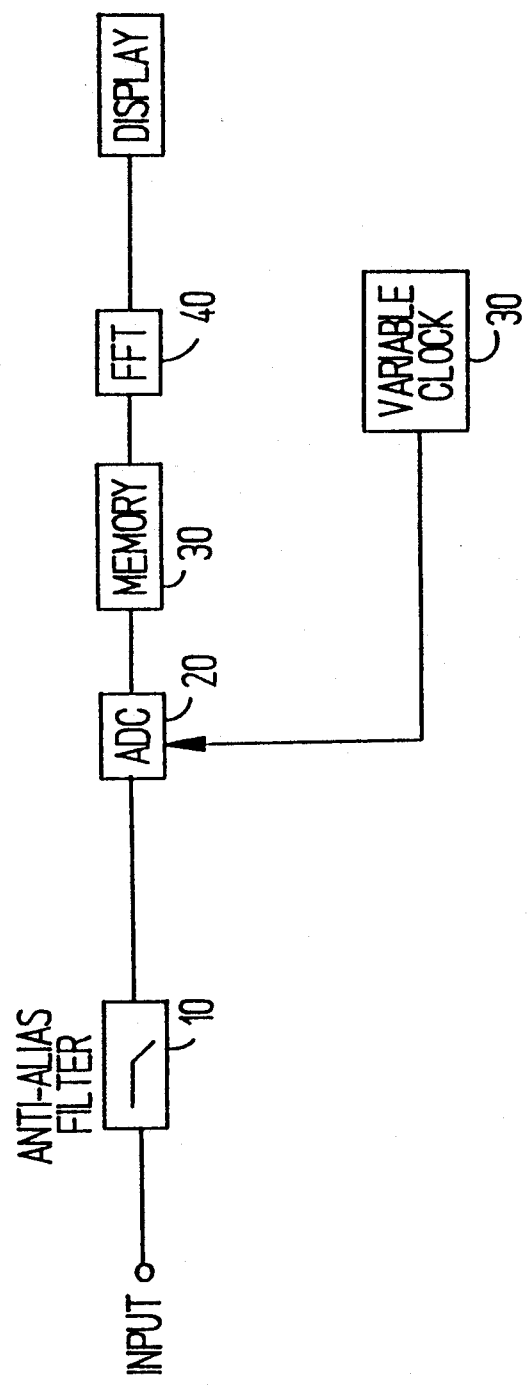
FIG. 4 is a schematic block diagram of a conventional digital oscilloscope with FFT.
Figure 5:
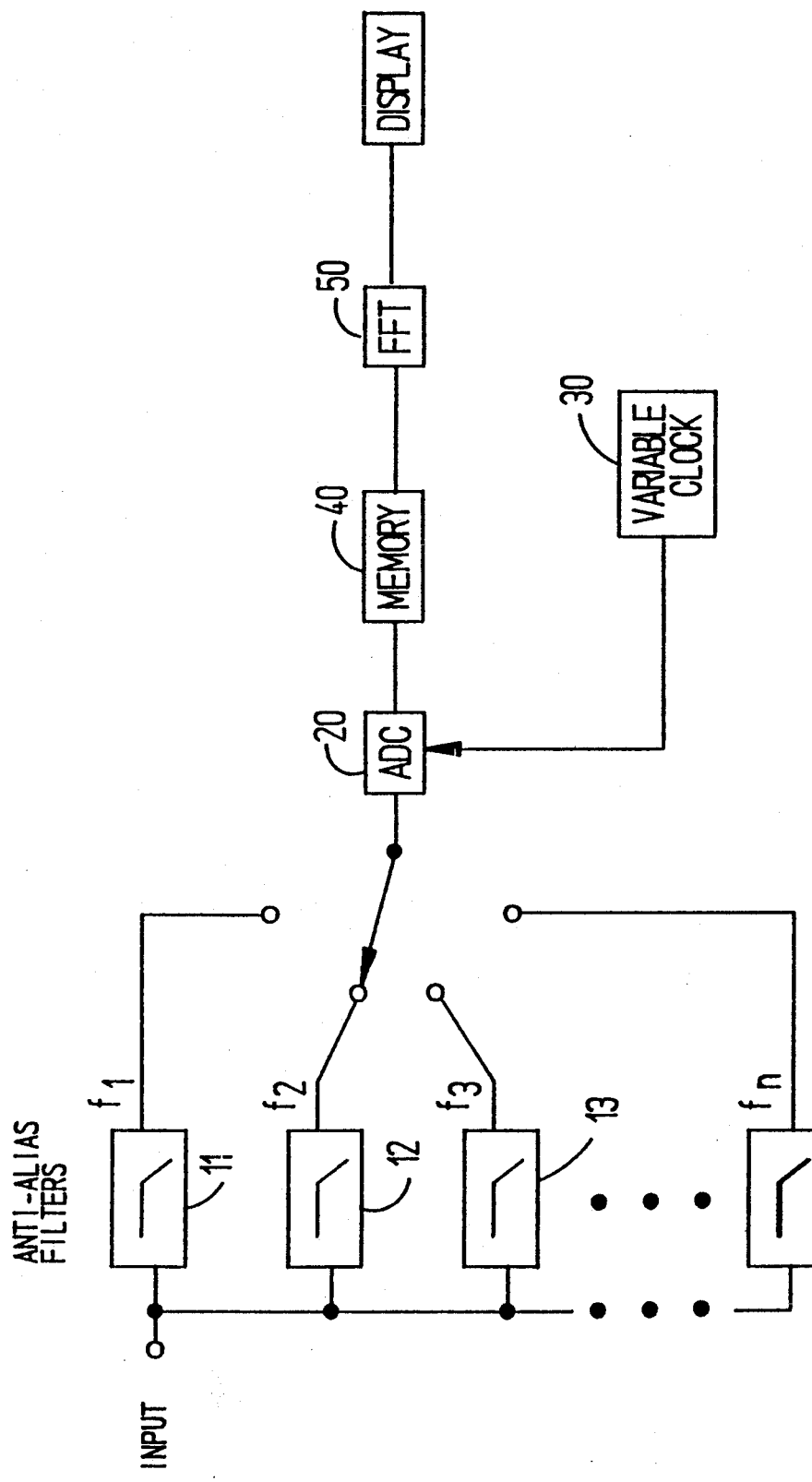
FIG. 5 is a schematic block diagram of a conventional digital oscilloscope with a selectable bank of analog low-pass filters.
Figure 6:
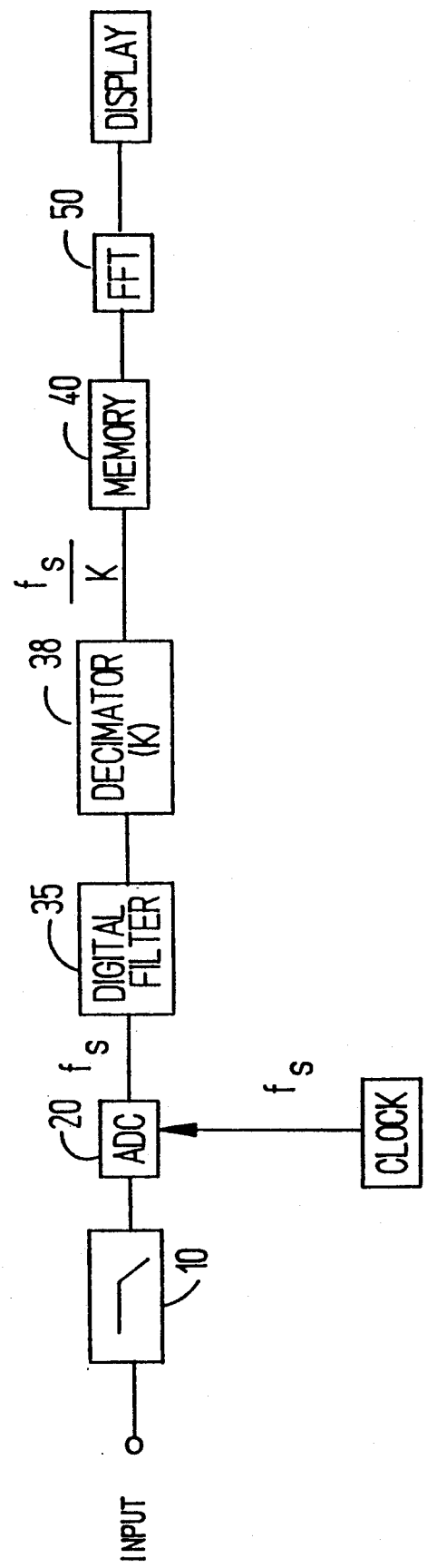
FIG. 6 is a schematic block diagram of a conventional FFT spectrum analyzer.
Figure 7:
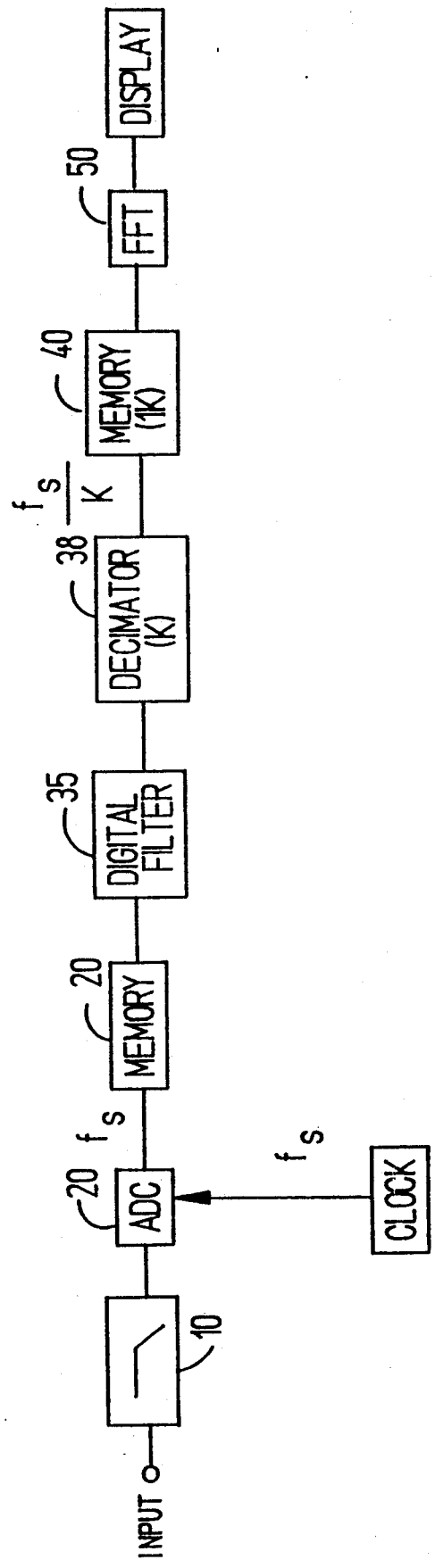
FIG. 7 is a schematic block diagram of a conventional digital oscilloscope with a post-acquisition digital filter.

As previously mentioned, the digital filter serves to further reduce the bandwidth of the samples to match the desired measurement bandwidth as shown in Table 1. The digital filter can have any of a number of different embodiments to accomplish this result. FIG. 3 is a block diagram of a digital finite impulse response ("FIR") filter which can be used for this purpose. The digital FIR filter operates in the digital domain to produce a series of output values, $y_n$, each of which is a weighted moving average of predetermined number of the previous input values, $x_n$, $x_{n-1}$, $X_{n-2}$, $X_{n-3}$, etc. For example, each of the output values $y_n$ produced by the digital FIR filter shown in FIG. 3 is determined as follows:

$$y_n = C_0 x_n + C_1 X_{n-1} + C_2 x_{n-2} + C_3 X_{n-3} + C_4 X_{n-4}$$

where the weighting factors, $C_0$, $C_1$, $C_2$, $C_3$, and $C_4$, are filter coefficients provided by the processor 75 to control the operating characteristics of the digital filter 35. The moving average function of the digital filter 35 smoothes the samples and effectively acts as a low-pass filter whose operating characteristics, including cut-off frequency, are controlled by the filter coefficients.

In the preferred embodiment, the samples output by the digital filter 35 are processed by a decimator 38 which passes only one sample out of each series of K samples. The decimation factor, K, is set by the processor 75. The maximum decimation factor is limited by the Nyquist limit. In other words, the effective sample rate after decimation ($f_s/K$) must be greater than twice the measurement bandwidth to prevent aliasing.

A typical FFT processor 50 requires 1024 samples to generate a good frequency spectrum analysis of the input signal. In the present invention, a second memory 40 is provided after the decimator 38 to store 1024 samples for use by the FFT processor 50. The necessary decimation factor K, and the minimum size of the first memory 25 can be determined by back calculation given the size of the second memory 40. It should also be noted that the 50 KHz measurement bandwidth shown in the bottom row of Table 1 is not the lowest possible measurement bandwidth in the low band. With a larger decimation factor K, the low band can have an arbitrary low measurement bandwidth.

Figure 2:
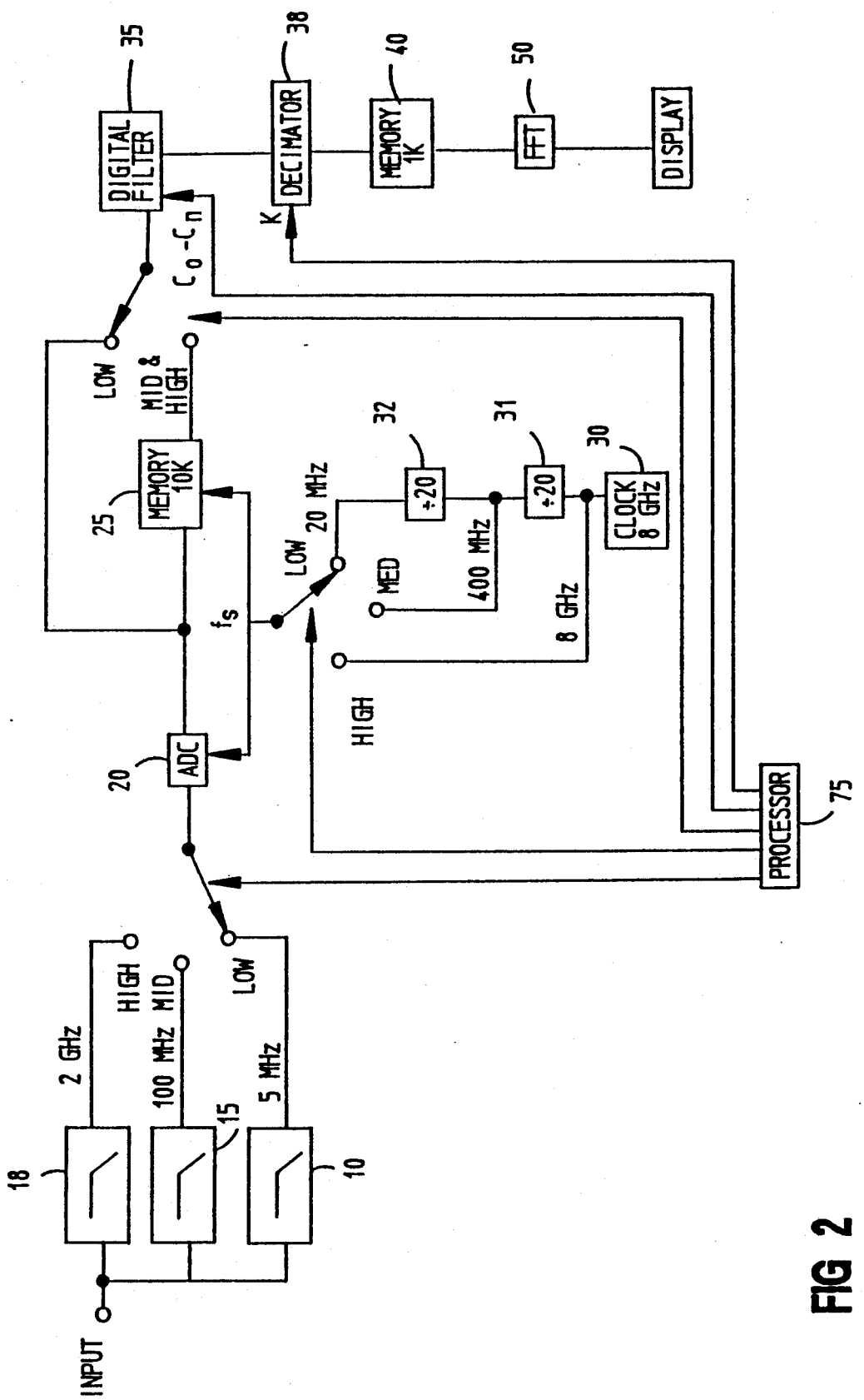
FIG. 2 is a schematic block diagram showing the major components of the present invention implemented for three bands of operation.

It should be expressly understood that the present invention can be implemented with more than two bands of operation. For example, FIG. 2 is a simplified block diagram of the present invention as implemented with three bands of operation. Table 2 is the corresponding state table for this implementation. Three analog low pass filters 10, 15, and 18 are connected in parallel to the input terminal. The first filter 18 has a cut-off frequency of approximately 8 GHz, the second filter 15 has a cut-off frequency of approximately 100 MHz, and the third filter 10 has cut-off frequency of approximately 5 MHz. As before, the user manually selects the range of frequencies (i.e. the measurement bandwidth) to be included in the frequency domain measurement by selecting the appropriate dial setting on the face of the instrument. The first column in Table 1 lists the various measurement bandwidths typically available on a digital oscilloscope. Given a measurement bandwidth specified by the user, the processor 75 selects the appropriate band for the instrument (i.e. high band, mid band, or low band). In the example depicted in FIG. 2 and Table 2, the three analog low-pass filters 18, 15, and 10 correspond to the high band, mid band, and low band of operation, respectively. The processor 75 selects the filter having the lowest cut-off frequency to prevent aliasing, but which is no lower than the measurement bandwidth. For example as shown in Table 2, the 2 GHz filter 18 is selected by the processor 75 for measurement bandwidths of 2 GHz, 1 GHz, 20 MHz, 500 MHz, and 200 MHz (high band). The 100 MHz filter 15 is selected for measurement bandwidths of 100 MHz, 50 MHz, 20 MHz, and 10 MHz (mid band). The 5 MHz filter 10 is used for measurement bandwidths of 5 MHz, 2 MHz, 1 MHz, 500 KHz, 200 KHz, 100 KHz and 50 KHz (low band).

The filtered input signal is passed to an analog-to-digital convertor ("ADC") 20 which samples and outputs a digital representation of the signal at a sample rate ($f_s$) controlled by the processor 75. The clock 30 produces clock pulses at 8 GHz. A first divider 31 reduces this rate to 400 MHz. A second divider further reduces this rate to 20 MHz. In the high band, the processor 75 connects the clock 30 directly to the clock input of the ADC 20 to drive the ADC at a high sample rate (8 GHz). In the mid band, the processor connects the first divider 31 to drive the ADC 20 at a medium sample rate (400 MHz). In the low band, the processor connects the second divider 32 to drive the ADC 20 at a low sample rate (20 MHz). This arrangement insures that the sample rate $f_s$ always exceeds the Nyquist limit (i.e. $f_s$ is at least twice the analog filter bandwidth) to prevent signal aliasing at any measurement bandwidth setting.

The digitized samples output by the ADC 20 are passed for processing by a digital low-pass filter 35. If the low sample rate (20 MHz) is being used, the digital filter 35 is capable of processing the samples in real time as they are output by the ADC 20. Therefore in the low band, the processor 75 directly connects the digital filter 35 to the output of the ADC 20. However, in the high band and mid band, a memory 25 is interposed between the ADC 20 and the digital 35 for temporary storage of the samples. A number of samples are stored in the memory 25 as they are output by the ADC 20. These samples can subsequently be retrieved and processed by the digital filter 35 at a slower rate. The filter coefficients ($C_0$ through $C_4$) of the digital filter 35 are controlled by the processor 75 to further reduce the bandwidth of the samples to match the desired measurement bandwidth as shown in Table 2.

The samples output by the digital filter 35 are then processed by a decimator 38 which passes only one sample out of each series of K samples, where K is controlled by the processor 75. A second memory 40 and a FFT processor 50 can be used to generate a frequency spectrum analysis from a set of the decimated samples, as previously discussed.

The above disclosure sets forth a number of embodiments of the present invention. Other arrangements or embodiments, not precisely set forth, could be practiced under the teachings of the present invention and as set forth in the following claims.

TABLE 1

| | Measurement Bandwidth | Analog Filter Bandwidth | ADC Sample Rate ($f_s$) | ADC Memory Depth Used | Digital Filter Bandwidth | Decimated Sample Rate ($f_s/k$) | Decimation Factor (k) |
|---|---|---|---|---|---|---|---|
| High Band | 100 MHz | 100 MHz | 400 MHz | 1024 | not used | 400 MHz | 1 |
| | 50 MHz | 100 MHz | 400 MHz | 2048 | 50 MHz | 200 MHz | 2 |
| | 20 MHz | 100 MHz | 400 MHz | 5120 | 20 MHz | 80 MHz | 5 |
| | 10 MHz | 100 MHz | 400 MHz | 10240 | 10 MHz | 40 MHz | 10 |
| Low Band | 5 MHz | 5 MHz | 20 MHz | not used | not used | 20 MHz | 1 |
| | 2 MHz | 5 MHz | 20 MHz | " | 2 MHz | 8 MHz | 2 |
| | 1 MHz | 5 MHz | 20 MHz | " | 1 MHz | 4 MHz | 5 |
| | 500 KHz | 5 MHz | 20 MHz | " | 500 KHz | 2 MHz | 10 |
| | 200 KHz | 5 MHz | 20 MHz | " | 200 KHz | 800 KHz | 25 |
| | 100 KHz | 5 MHz | 20 MHz | " | 100 KHz | 400 KHz | 50 |
| | 50 KHz | 5 MHz | 20 MHz | " | 50 KHz | 200 KHz | 100 |

TABLE 2

| | Measurement Bandwidth | Analog Filter Bandwidth | ADC Sample Rate ($f_s$) | ADC Memory Depth Used | Digital Filter Bandwidth | Decimated Sample Rate ($f_s/k$) | Decimation Factor (k) |
|---|---|---|---|---|---|---|---|
| High Band | 2 GHz | 2 GHz | 8 GHz | 1024 | not used | 8 GHz | 1 |
| | 1 GHz | 2 GHz | 8 GHz | 2048 | 1 GHz | 4 GHz | 2 |
| | 500 MHz | 2 GHz | 8 GHz | 4096 | 500 MHz | 2 GHz | 4 |
| | 200 MHz | 2 GHz | 8 GHz | 10240 | 200 MHz | 800 MHz | 10 |
| Mid Band | 100 MHz | 100 MHz | 400 MHz | 1024 | not used | 400 MHz | 1 |
| | 50 MHz | 100 MHz | 400 MHz | 2048 | 50 MHz | 200 MHz | 2 |
| | 20 MHz | 100 MHz | 400 MHz | 5120 | 20 MHz | 80 MHz | 5 |
| | 10 MHz | 100 MHz | 400 MHz | 10240 | 10 MHz | 40 MHz | 10 |
| Low Band | 5 MHz | 5 MHz | 20 MHz | not used | not used | 20 MHz | 1 |
| | 2 MHz | 5 MHz | 20 MHz | " | 2 MHz | 8 MHz | 2 |
| | 1 MHz | 5 MHz | 20 MHz | " | 1 MHz | 4 MHz | 5 |
| | 500 KHz | 5 MHz | 20 MHz | " | 500 KHz | 2 MHz | 10 |
| | 200 KHz | 5 MHz | 20 MHz | " | 200 KHz | 800 KHz | 25 |
| | 100 KHz | 5 MHz | 20 MHz | " | 100 KHz | 400 KHz | 50 |
| | 50 KHz | 5 MHz | 20 MHz | " | 50 KHz | 200 KHz | 100 |

I claim:

1. An anti-alais filter apparatus comprising:
    an input terminal for receiving an input signal having a number of frequency components;
    control means for selecting one of a predetermined plurality of measurement bandwidths;
    clock means for generating a series of clock pulses at any of a plurality of sample rates selectively controlled by said control means, said selected sample rate (fhd s) being equal to at least twice said selected measurement bandwidth;
    a plurality of low-pas filter means connected to said input terminal and said control means, said low-pass filter means having a plurality of cut-off frequencies selectively controlled by said control cut-off frequencies selectively controlled by said control means to output a signal having a cut-off frequency at least as great as said selected measurement bandwidth;
    an analog-to-digital convertor ("ADC") connected to sample said signal output by said low-pass filter means and to output a digital representation of said signal at said sample rate controlled by said clock means;
    memory means to receive and store a plurality of said digital samples from said ADC; and
    a digital low-pass filter having an input to receive said samples from said memory means and an output providing a digital representation of said low frequency components of said samples within said selected measurement bandwidth.

2. The anti-alias filter apparatus of claim 1 further comprising memory bypass switching means for selectively connecting said output of said ADC to the input of said digital low-pass filter when said sample rate is less than a predetermined limit, and to transfer said samples stored in said memory to the input to said digital low-pass filter when said sample rate is greater than said limit.

3. The anti-alias filter apparatus of claim 1 further comprising a decimator connected to said output of said digital low-pass filter to output one sample from each series of K samples received from said digital low-pass filter, where K is a positive integer variably determined by said control means.

4. The anti-alias filter apparatus of claim 3 further comprising:
    a second memory to receive and store a plurality of said samples output by said decimator; and means for generating a frequency domain measurement of said samples stored in said second memory.

5. The anti-alias filter apparatus of claim 3 wherein the decimation factor K of said decimator is determined by said control means such that $f_s/K$ is at least twice said selected measurement bandwidth.

6. An anti-alias filter apparatus comprising:
an input terminal for receiving an input signal having a number of frequency components;
control means for selecting one of a predetermined plurality of measurement bandwidths;
clock means for generating a series of clock pulses at any of a plurality of sample rates selectively controlled by said control means, said selected sample rate ($f_s$) being equal to at least twice said selected measurement bandwidth;
a plurality of low-pass filter means connected to said input terminal and said control means, said low-pass filter means having a plurality of cut-off frequencies selectively controlled by said control means to output a signal having a cut-off frequency at least as great as said selected measurement bandwidth;
an analog-to-digital converter ("ADC") connected to sample said signal output by said low-pass filter means and to output a digital representation of said signal at said sample rate controlled by said clock means;
a first memory means to receive and store a plurality of said digital samples from said ADC;
a digital low-pass filter having an input to receive said samples from said first memory means and an output providing a digital representation of said low frequency components of said samples within said selected measurement bandwidth;
a decimator connected to said output of said digital low-pass filter to output one sample from each series of K samples received from said digital low-pass filter, where K is a positive integer variably determined by said control means;
a second memory means to receive and store a plurality of said samples output by said decimator; and
means for generating a frequency domain measurement of said samples stored in said second memory.

7. The anti-alias filter apparatus of claim 6 further comprising memory bypass switching means for selectively connecting said output of said ADC to the input of said digital low-pass filter when said sample rate is less than a predetermined limit, and to transfer said samples stored in said memory to the input of said digital low-pass filter when said sample rate is greater than said limit.

8. The anti-alias filter apparatus of claim 6 wherein the decimation factor K of said decimator is determined by said control means such that $f_s/K$ is at least twice said selected measurement bandwidth.

9. An anti-alias filter apparatus comprising:
an input terminal or receiving an input signal having a number of frequency components;
control means for selecting one of a predetermined plurality of measurement bandwidths;
clock means for generating a series of clock pulses at either a high sample rate or a low sample rate selectively controlled by said control means, said selected sample rate ($f_s$) being equal to at least twice said selected measurement bandwidth;
a first low-pass filter connected to said input terminal to output a signal having a cut-off frequency at least as great as the maximum measurement bandwidth;
a second low-pass filter connected to said input terminal to output a signal having a predetermined cut-off frequency less than said cut-off frequency of said first low-pass filter;
switching means controlled by said control means to select either said first low-pass filter or said second low-pass filter such that the cut-off frequency of the selected low-pass filter is at least as great as said selected measurement bandwidth;
an analog-to-digital convertor ("ADC") connected to sample said signal output by said selected low-pass filter and to output a digital representation of said signal at said selected sample rate controlled by said clock means;
a digital finite impulse response ("FIR") filter to receive a series of digital sample and to output a digital representation of said low frequency components of said samples within said selected measurement bandwidth, operation of said digital FIR filter being adjustably controlled by a number of filter coefficients determined by said control means;
a first memory means to store a plurality of said digital samples from said ADC if said high sample rate is selected, and to subsequently output said stored samples to said digital FIR filter;
a memory bypass switching means for connecting said samples output by said ADC to said digital FIR filter if said low sample rate is selected;
a decimator connected to said output of said digital FIR filter to output one sample from each series of K samples received from said digital FIR filter where K is a positive integer determined by said control mean such that $f_s/K$ is at least twice said selected measurement bandwidth;
a second memory means to store a plurality of said samples output by said decimator; and
means for generating a frequency domain measurement of said sample stored in said second memory.

10. An anti-alias filter apparatus comprising:
an input terminal for receiving an input signal having a number of frequency components;
control means for selecting one of a predetermined plurality of measurement bandwidths;
clock means for generating a series of clock pulses at either a high sample rate, a middle sample rate, or a low sample rate selectively controlled by said control means, said selected sample rate ($f_s$) being equal to at least twice said selected measurement bandwidth;
a first low-pass filter connected to said input terminal to output a signal having a cut-off frequency at least as great as the maximum measurement bandwidth;
a second low-pass filter connected to said input terminal to output a signal having a predetermined cut-off frequency less than said cut-off frequency of said first low-pass filter;
a third low-pass filter connected to said input terminal to output a signal having a predetermined cut-off frequency less than said cut-off frequency of said second low-pass filter;
switching means controlled by said control means to select either said first low-pass filter, said second low-pass filter, or said third low-pass filter such that the cut-off frequency of the selected low-pass filter is at least as great as said selected measurement bandwidth;

an analog-to-digital convertor ("ADC") connected to sample said signal output by said selected low-pass filter and to output a digital representation of said signal at said selected sample rate controlled by said clock means;

a digital finite impulse response ("FIR") filter to receive a series of digital samples and to output a digital representation of said low frequency components of said samples within said selected measurement bandwidth, operation of said digital FIR filter being adjustably controlled by a number of filter coefficients determined by said control means;

a filter memory means to store a plurality of said digital samples from said ADC if said low sample rate is not selected, and to subsequently output said stored samples to said digital FIR filter;

a memory bypass switching means for connecting said sample output by said ADC to said digital FIR filter if said low sample rate is selected;

a decimator connected to said output of said digital FIR filter to output one sample from each series of K samples received from said digital FIR filter, where K is a positive integer determined by said control mean such that $f_s/K$ is at least twice said selected measurement bandwidth;

a second memory means to store a plurality of said samples output by said decimator; and means for generating a frequency domain measurement of said samples stored in said second memory.

* * * * *

UNITED STATES PATENT AND TRADEMARK OFFICE
CERTIFICATE OF CORRECTION

PATENT NO. : 5,233,546
DATED : August 3, 1993
INVENTOR(S) : Robert Witte

It is certified that error appears in the above-indentified patent and that said Letters Patent is hereby corrected as shown below:

Col. 7, l. 61: delete "(fhd s)" and insert therefore --$(f_s)$--;

Col. 7, l. 63: delete "low-pas" and insert therefore --low-pass--;

Col. 7, ls. 67-68: delete "cut-off frequencies selectively controlled by said control";

Col. 9, l. 58: delete "or" and insert therefore --for--;

Col. 10, l. 18: delete "sample" and insert therefore --samples--;

Col. 10, l. 36: delete "mean" and insert therefore --means--;

Col. 10, l. 41: delete "sample" and insert therefore --samples--;

Col. 10, l. 34: after "filter" insert --,--;

Col. 11, l. 16: delete "filter" and insert therefore --first--;

UNITED STATES PATENT AND TRADEMARK OFFICE
CERTIFICATE OF CORRECTION

PATENT NO. : 5,233,546
DATED : August 3, 1993
INVENTOR(S) : Robert Witte

It is certified that error appears in the above-indentified patent and that said Letters Patent is hereby corrected as shown below:

Col. 12, l. 4:  delete "sample" and insert therefore --samples--;

Col. 12, l. 10: delete "mean" and insert therefore --means--.

Signed and Sealed this

Second Day of May, 1995

Attest:

BRUCE LEHMAN

Attesting Officer     Commissioner of Patents and Trademarks